United States Patent [19]
Hart

[11] Patent Number: 4,855,944
[45] Date of Patent: Aug. 8, 1989

[54] NOISE GENERATOR WITH SHAPED SPECTRUM

[75] Inventor: Billy D. Hart, Cedar Rapids, Iowa

[73] Assignee: Rockwell International Corporation, El Segundo, Calif.

[21] Appl. No.: 94,250

[22] Filed: Sep. 4, 1987

[51] Int. Cl.⁴ .............................................. G06V 1/00
[52] U.S. Cl. ...................................... 364/602; 331/78; 364/607; 364/717.5
[58] Field of Search .............. 364/602, 607, 825, 717, 364/724, 717.5, 724.16, 724.17, 724.19; 375/1; 331/78

[56] References Cited

U.S. PATENT DOCUMENTS

| | | | |
|---|---|---|---|
| 3,742,381 | 6/1973 | Hurd | 331/78 |
| 3,885,139 | 5/1975 | Hurd | 331/78 X |
| 3,967,102 | 6/1976 | McCown | 364/724 |
| 3,968,354 | 7/1976 | Ferrieu | 364/724 |
| 4,125,898 | 11/1978 | DeHart et al. | 364/718 |
| 4,161,041 | 9/1975 | Butler et al. | 365/244 |
| 4,291,386 | 9/1981 | Bass | 364/717 |
| 4,296,384 | 10/1981 | Mishima | 331/78 |
| 4,302,631 | 11/1981 | Shenoi et al. | 364/724 X |
| 4,353,031 | 10/1982 | Bock | 328/62 |
| 4,468,794 | 8/1984 | Waters et al. | 364/724 X |
| 4,542,475 | 9/1985 | Acompora | 364/724 |
| 4,550,414 | 10/1985 | Guinon et al. | 364/819 X |
| 4,558,454 | 12/1985 | Hills et al. | 364/724 X |
| 4,611,183 | 9/1986 | Piosenka et al. | 331/78 |
| 4,751,663 | 6/1988 | Yamazaki | 364/724 |

Primary Examiner—Joseph Ruggiero
Attorney, Agent, or Firm—M. Lee Murrah; V. Lawrence Sewell; H. Fredrick Hamann

[57] ABSTRACT

Pseudorandom noise having a predetermined frequency spectrum is generated by implementing a finite impulse response filter as an integral part of a feedback shift register sequence generator.

8 Claims, 2 Drawing Sheets

NOISE GENERATOR WITH SHAPED SPECTRUM

BACKGROUND OF THE INVENTION

This invention was made with Government support under Contract No. N00019-84-C-0128 MOD P00003 awarded by Department of the Navy, Naval Air Systems Command, Washington, D.C. The Government has certain rights in this invention.

The invention relates to pseudorandom noise generators, and more particularly to noise generators having a predetermined output spectrum, and most particularly to such noise generators incorporating a finite impulse response (FIR) filter.

A noise generator with known and repeatable characteristics is often used in electronic systems for calibration, testing, sound synthesis, or dither. One of the most commonly used pseudorandom noise (PN) generators is a feedback shift register sequence generator, which is described in *Spread Spectrum Systems* by R. C. Dixon (Wiley, 1976) and in *Error Correcting Codes* by W. W. Peterson and E. J. Weldon (MIT Press 2 ed. 1972). Briefly, the method underlying this type of PN generator consists of shifting a sequence of bits through a shift register comprising a multiplicity of flip-flops. The output of the last flip-flop is fed back to the input of the first flip-flop through an EXCLUSIVE-OR gate. One or more additional input signals for the EXCLUSIVE-OR gate are taken from between stages of the shift register. Taps are taken between several of the flip-flops, and summed through resistors comprising a digital-to-analog converter, the output of which is a waveform having a randomly varying amplitude, i.e., noise.

One characteristic that is often desirable in a noise generator is a specific frequency spectrum. In the past a desired spectrum has been obtained either by digital processing of the summed shift register outputs followed by digital-to-analog (D/A) conversion or by analog filtering after D/A conversion. U.S. Pat. No. 4,296,384 to Mishima is illustrative of the filtering after analog conversion approach. Such methods are complicated and required a large component count, the latter being a serious disadvantage in modern design where circuit board space is at a premium.

Finite impulse response (FIR) filters are well known in the art as shown by U.S. Pat. No. 4,542,475 to Acompora. Like the prior art shift register noise generators, FIR filters use a D/A converter of the summing resistor type with inputs taken from taps between shift register stages. However, the D/A converter is implemented in a different way for an entirely different purpose. The taps are taken at selected ones of the stages, and the contributions of the taps are weighted in accordance with known principles. FIR filters have always been used to filter an external signal but never as an integral part of a feedback shift register noise generator. Feedback shift register noise generators as implemented in the prior art provide some inherent filtering, as do many circuits, but it is of an unintentional, undirected, and previously unrecognized nature.

It is therefore an object of the present invention to provide filtered noise directly from the shift register with full control over the spectrum.

It is another object of the present invention to provide a simple means of providing filtered noise.

It is a further object of the present invention to provide filtered noise in a circuit which reduces component count.

SUMMARY OF THE INVENTION

The invention is the first self-filtering pseudorandom noise generator. This is accomplished by implementing a FIR filter in a feedback shift register sequence generator by applying a suitable multiplier to interstage shift register signals and summing them together to provide a spectrum of the desired frequency content.

BRIEF DESCRIPTION OF THE DRAWINGS

The invention may be more fully understood by reading the following description of a preferred embodiment of the invention in conjunction with the appended drawings wherein.

DETAILED DESCRIPTION OF A PREFERRED EMBODIMENT

Figure 1:
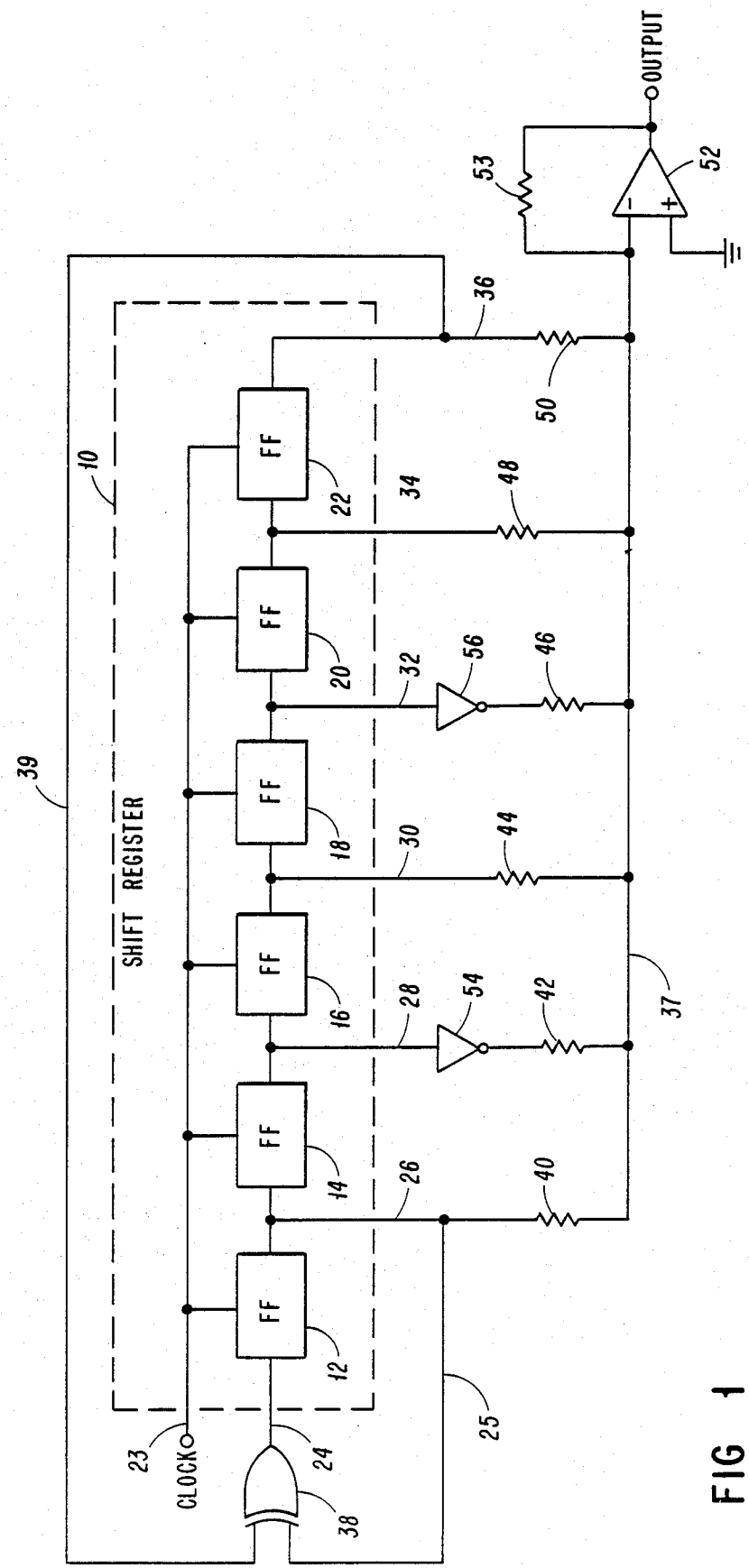
FIG. 1 shows a shift register noise generator with integral finite impulse response filtering in accordance with the present invention.

Referring first to the FIG. 1, a shift register 10 is comprised of a multiplicity of serially connected flip-flops 12, 14, 16, 18, 20, and 22. Although only six such flip-flops are shown, it should be understood that any number may be used and still remain within the scope of the invention. Each of the flip-flops is connected to a clock signal via line 23, and data is applied to the first flip flop 12 via line 24. As is well-known, on each clock cycle a data bit on line 24 is shifted into flip-flop 12; and with each successive clock cycle the data bit is shifted to flip-flop 14, to flip-flop 16, and so on until the data bit reaches flip-flop 22. The data bit in flip-flop 22 is fed back to one input of an EXCLUSIVE-OR gate 38 via line 39. The second input to EXCLUSIVE-OR gate 38 is derived from an output of an intermediate flip flop stage, in this case from flip-flop 12 via lines 26 and 25. The output of EXCLUSIVE-OR gate 38 is applied on line 24 to the input of shift register 10 at flip flop 12 as previously described. This circuit will produce a maximally long sequence which functions as a pseudorandom number, and consequently as "noise". The randomness of the sequence can be improved by increasing the number of flip flop stages in shift register 10.

A FIR filter is integrated with the pseudorandom noise generator to shape the output spectrum by taking outputs between the flip-flop stages on lines 26, 28, 30, 32, 34, and 36. The signal on each line has applied to it a multiplier, and the results are summed on line 37. By properly selecting the multiplier in each line in accordance with well known techniques, such as the Parks-McClellan FIR filter design algorithm, a composite signal of the desired spectrum can be attained on line 37. For simpler cases filter design can be efficiently accomplished using Z-transform techniques. The signals appearing on line 37 are summed and amplified by an amplifier comprising an operational amplifier 52 having a feedback resistor 53.

In the embodiment shown in FIG. 1, the filter multipliers are provided by the conductance values of resistors 40, 42, 44, 46, 48, and 50, in lines 26, 28, 30, 32, 34, and 36, respectively, and by inverters 54 and 56 in lines 28 and 32, respectively. Where a positive multiplier is desired, only a resistor such as resistor 40 in line 26 is used. However, if a negative multiplier is required, an inverter may inserted into a line in addition to a resistor, such as line 28 where inverter 54 inverts the interstage signal from flip-flop 14 and applied it to resistor 42. The composite signal on line 37 can be tailored by individually adjusting the values of resistors 40, 42, 44, 46, 48, and 50. Although all interstage signals are shown as being used to produce the desired signal on line 37, it should be understood that only part of the interstage signals might be used as required. If an interstage signal is not used, that is equivalent to a line multiplier of zero.

Figure 2A:
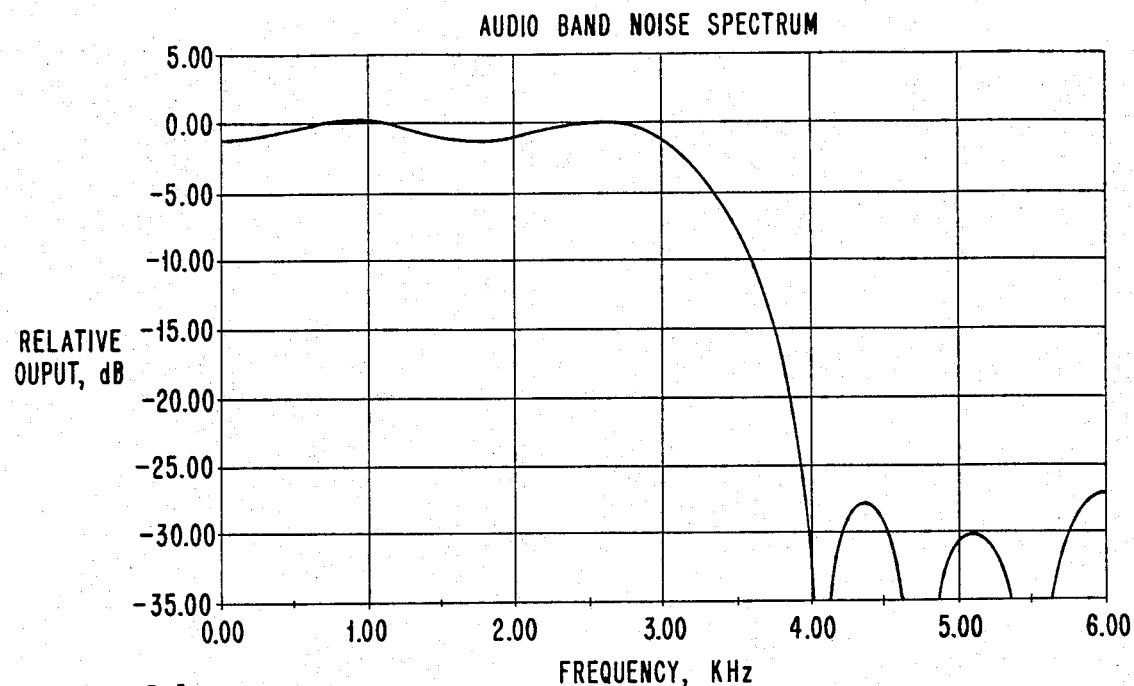
FIGS. 2A and 2B are frequency plots showing the spectra of two noise generators in accordance with the present invention.
Figure 2B:
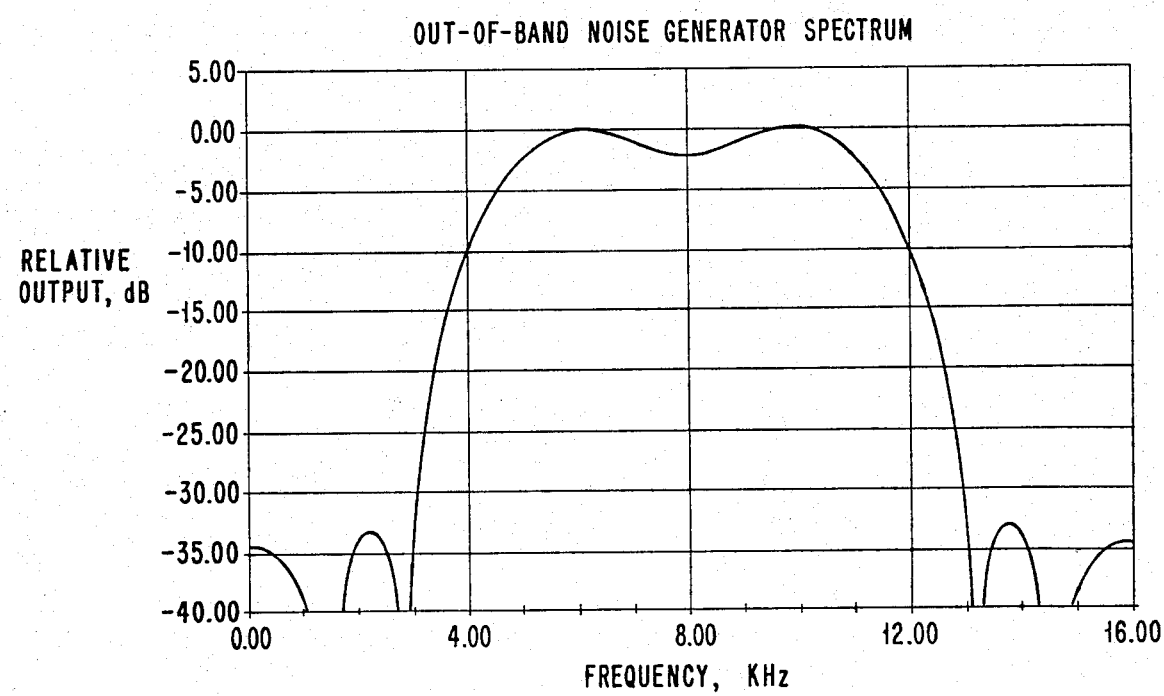

The spectra of two noise generators designed in accordance with the principles of the present invention are shown in FIGS. 2A and 2B. Spectra produced by FIR filters have a series of maxima and minima. The shape of the spectra can be altered by the judicious choice of interstage multipliers as discussed above, while the locations of the maxima and minima are largely a function of the frequency at which the shift register is clocked.

Referring to the particular examples, FIG. 2A shows the spectrum of a noise generator providing noise in a desired band. This spectrum was produced using a 15 stage generator in accordance with the present invention having a shift register clock of 12 KHz. Table 1 shows the values of the FIR filter coefficients required to obtain the frequency plot of FIG. 2A, and the inverters (such as inverter 54 in FIG. 1) and resistors (such as resistor 40 in FIG. 1) necessary to obtain the coefficient.

TABLE 1

| Audio Bandpass Noise Source | | | | |
|---|---|---|---|---|
| No. | Coefficient | 1/Coefficient | Inverter? | Resistor (K Ohms) |
| 1 | −0.00875 | −114.2 | yes | 66.5 |
| 2 | −0.0497 | −20.1 | yes | 11.5 |
| 3 | 0.0167 | 59.8 | no | 34.8 |
| 4 | 0.0552 | 18.1 | no | 10.5 |
| 5 | −0.0713 | −14.0 | yes | 8.06 |
| 6 | −0.0714 | −14.0 | yes | 8.06 |
| 7 | −0.3055 | 3.273 | no | 1.87 |
| 8 | 0.5777 | 1.73 | no | 1.00 |
| 9 | 0.3055 | 3.273 | no | 1.87 |
| 10 | −0.0714 | −14.0 | yes | 8.06 |
| 11 | −0.0713 | −14.0 | yes | 8.06 |
| 12 | 0.0552 | 18.1 | no | 10.5 |
| 13 | 0.0167 | 59.8 | no | 34.8 |
| 14 | −0.0497 | 20.1 | yes | 11.5 |
| 15 | −0.00875 | −114.2 | yes | 66.5 |

FIG. 2B shows the spectrum of a noise generator providing noise outside a desired band. This spectrum was produced using a 9 stage generator in accordance with the present invention having a shift register clock of 16 KHz. Table 2 shows the same information as Table 1 for this configuration.

TABLE 2

| Out-of-Band Bandpass Noise Source | | | | |
|---|---|---|---|---|
| No. | Coefficient | 1/Coefficient | Inverter? | Resistor (K Ohms) |
| 1 | −0.0397 | −25.2 | yes | 12.1 |
| 2 | 0.0991 | 10.1 | no | 4.87 |
| 3 | 0.0232 | 43.1 | no | 20.5 |
| 4 | −0.3089 | −3.237 | yes | 1.54 |
| 5 | 0.4775 | 1.752 | no | 1.00 |
| 6 | −0.3089 | −3.237 | yes | 1.54 |
| 7 | 0.0232 | 43.1 | no | 20.5 |
| 8 | 0.0991 | 10.1 | no | 4.87 |
| 9 | −0.0397 | −25.2 | yes | 12.1 |

Both examples in FIGS. 2A and 2B were designed using the Parks-McClellan FIR filter design algorithm. Coefficients are inversely proportional to resistor value. Resistor values were scaled to the smallest value of 1K ohm and nearest standard resistor values.

References for this algorithm and other suitable FIR design methods are as follows:

1. McClellan, James H., Parks, T. W., and Rabiner, L. R., "A Computer Program for Designing Optimum FIR Linear Phase Digital Filters," IEEE Trans. Audio and Electroacoustics, AU-21, pp. 506–526, December 1973.

2. Rabiner, L. R., Gold, B., *Theory and Application of Digital Signal Processing*, Prentice-Hall, 1975 (Chapter 3).

3. Oppenheim, A. V. and Shafer, R. W., *Digital Signal Processing*, Prentice-Hall, 1975 (Chapters 3 and 5).

While particular embodiments of the present invention have been shown and described, it is obvious that minor changes and modifications may be made therein without departing from the true scope and spirit of the invention. It is the intention in the appended claims to cover all such changes and modifications.

I claim:

1. A pseudorandom noise generator, comprising:
    a feedback shift register sequence generator, having a multiplicity of stages, each presenting an interstage signal;
    means for multiplying at least one of said interstage signals by a predetermined factor; and
    means for summing signals produced by said multiplying means to produce pseudorandom noise having a desired frequency spectrum.

2. A pseudorandom noise generator as described in claim 1 wherein said multiplying means comprises a resistor for receiving each of said interstage signals.

3. A pseudorandom noise generator as described in claim 2 wherein said multiplying means further comprises an inverter to receive each of selected ones of said interstage signals.

4. A pseudorandum noise generator, comprising:
    A FIR filter having a multiplicity of stages 1 . . . n, each of said stages having an input and an output; and
    An EXCLUSIVE-OR gate for applying output signals from at least one of said stages to the 1st stage.

5. A pseudorandom noise generator as described in claim 4 wherein said EXCLUSIVE-OR gate applies an output signal from the n-th stage of the FIR filter.

6. A pseudorandom noise generator as described in claim 5 wherein said EXCLUSIVE-OR gate further applies an output signal from at least one stage of the FIR filter below the n-th stage.

7. A pseudorandom noise generator as described in claim 6 wherein said one stage below the n-th stage is the 1st stage.

8. A pseudorandom noise generator, comprising:
    a shift register comprising a multiplicity of stages;
    feedback means for applying the output from at least one of said stages to the first stage thereof;
    means for deriving signals from at least one of the stages;
    means for multiplying each of said derived signals by a predetermined factor; and
    means for summing said multiplied signals to produce pseudorandom noise having a desired frequency spectrum.

* * * * *